(12) United States Patent
Ito et al.

(10) Patent No.: US 10,480,873 B2
(45) Date of Patent: Nov. 19, 2019

(54) FLOW PATH MEMBER, AND ADSORPTION DEVICE AND COOLING DEVICE USING THE SAME

(71) Applicant: KYOCERA Corporation, Kyoto-shi, Kyoto (JP)

(72) Inventors: Kou Ito, Hakodate (JP); Kouji Teramoto, Koka (JP); Hiroyasu Momikura, Omihachiman (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 608 days.

(21) Appl. No.: 14/403,848

(22) PCT Filed: May 21, 2013

(86) PCT No.: PCT/JP2013/063997
§ 371 (c)(1),
(2) Date: Nov. 25, 2014

(87) PCT Pub. No.: WO2013/179936
PCT Pub. Date: Dec. 5, 2013

(65) Prior Publication Data
US 2015/0122464 A1    May 7, 2015

(30) Foreign Application Priority Data
May 30, 2012 (JP) .................................. 2012-123084

(51) Int. Cl.
F28F 13/12    (2006.01)
F28D 15/00    (2006.01)
F28F 21/04    (2006.01)

(52) U.S. Cl.
CPC .............. *F28F 21/04* (2013.01); *F28D 15/00* (2013.01); *F28F 13/12* (2013.01)

(58) Field of Classification Search
CPC . F28D 2021/0028; F28F 2255/18; F28F 7/02; F28F 21/04; B24B 37/12; B24B 37/04; H01L 21/67109
See application file for complete search history.

(56) References Cited

U.S. PATENT DOCUMENTS 6,951,587 B1 * 10/2005 Narushima ......... C23C 16/4586
                                                        118/728
7,722,828 B2 *  5/2010 Zuberi .................... F01N 13/10
                                                        422/177
(Continued)

FOREIGN PATENT DOCUMENTS

JP   2000-108020 A   4/2000
JP   2003-273202 A   9/2003
(Continued)

OTHER PUBLICATIONS

Extended European Search Report, European Patent Application No. 13798153.6, dated Dec. 15, 2015, 7 pgs.
(Continued)

*Primary Examiner* — Frantz F Jules
*Assistant Examiner* — Martha Tadesse
(74) *Attorney, Agent, or Firm* — Volpe and Koenig, P.C

(57) ABSTRACT

A flow path member 1 according to one aspect of the invention includes a main body 4 formed of a ceramic sintered body in which a first flow path 6 is provided so as to allow a fluid to flow therethrough, wherein the main body 4 includes a projection 10 formed of part of the ceramic sintered body on an inner wall of the first flow path 6.

12 Claims, 4 Drawing Sheets

(56) References Cited

U.S. PATENT DOCUMENTS

| | | | |
|---|---|---|---|
| 7,938,577 B2* | 5/2011 | Takahashi | H01L 21/67109 |
| | | | 374/147 |
| 9,448,014 B2* | 9/2016 | Tsubokawa | H01L 23/473 |
| 2003/0178638 A1* | 9/2003 | Fujii | H01L 21/68757 |
| | | | 257/192 |
| 2004/0016792 A1 | 1/2004 | Fujii et al. | |
| 2005/0260938 A1* | 11/2005 | Okuda | B24B 37/015 |
| | | | 451/285 |
| 2008/0289767 A1 | 11/2008 | Tandou et al. | |
| 2009/0283034 A1 | 11/2009 | Natsuhara et al. | |

FOREIGN PATENT DOCUMENTS

| | | |
|---|---|---|
| JP | 2004-050267 A | 2/2004 |
| JP | 2008-004926 A | 1/2008 |
| JP | 2008-294146 A | 12/2008 |
| JP | 2009-141204 A | 6/2009 |
| JP | 2010-272873 A | 12/2010 |
| JP | 2012-049453 A | 3/2012 |

OTHER PUBLICATIONS

Japanese Office Action with English concise explanation, Japanese Patent Application No. 2014-518391, dated Aug. 23, 2016, 4 pgs.
International Search Report (Form PCT/ISA/210) dated Aug. 20, 2013 issued for PCT/JP2013/063997.

* cited by examiner

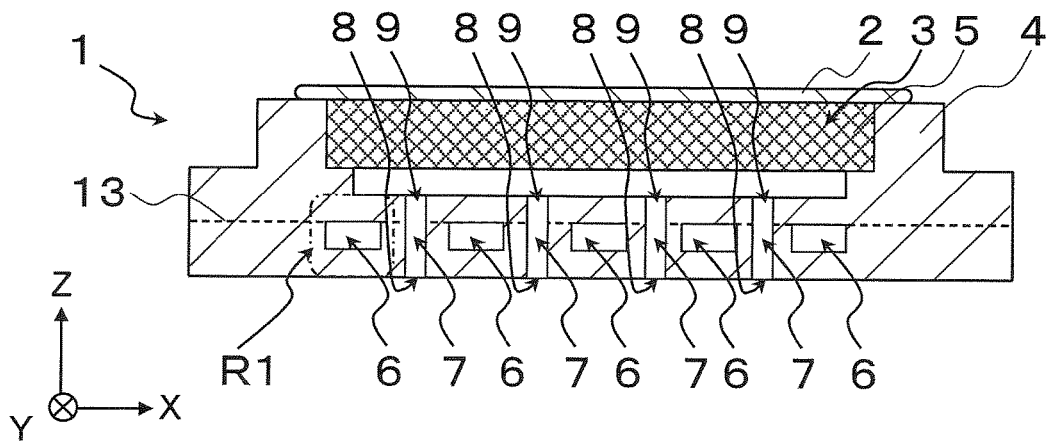
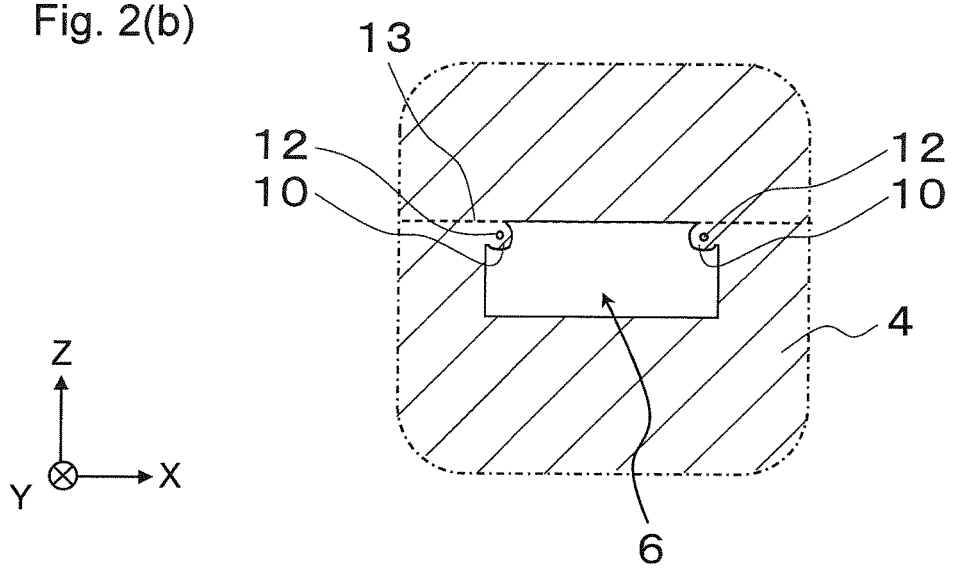
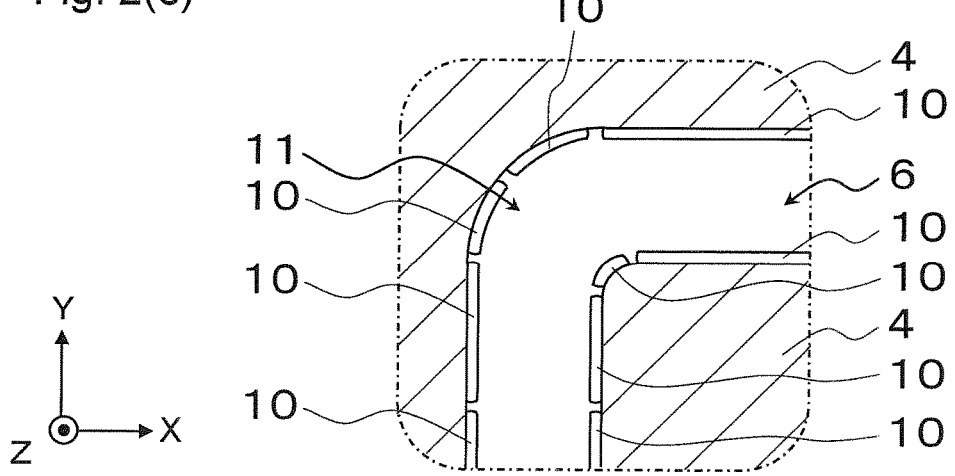

FLOW PATH MEMBER, AND ADSORPTION DEVICE AND COOLING DEVICE USING THE SAME

TECHNICAL FIELD

The present invention relates to a flow path member used for, for example, semiconductor manufacturing apparatuses or flat panel display (FPD) manufacturing apparatuses, and an adsorption device and a cooling device using the flow path member.

BACKGROUND ART

In general, semiconductor manufacturing apparatuses and FPD manufacturing apparatuses have been used to manufacture semiconductor devices and FPDs by processing a workpiece such as semiconductor wafer and glass substrate. Those manufacturing apparatuses may use a flow path member in which flow paths are formed so as to allow a fluid to flow therethrough.

For example, when heat is generated during processing of the workpiece in semiconductor manufacturing apparatuses that perform back grinding process, the workpiece is heat-expanded and processing accuracy of the workpiece tends to be decreased. The decrease in processing accuracy of the workpiece may cause damage to the workpiece.

In order to address that problem, cooling of a workpiece by using a flow path member in which flow paths are formed so as to allow a cooling fluid to flow therethrough is proposed, for example, as disclosed in Japanese Unexamined Patent Application Publication No. 2000-108020.

In these years, as the semiconductor devices and FPDs become thinner and their wirings become finer, high processing accuracy is required for the workpiece and there is a need of improving a cooling efficiency of the workpiece by the flow path member.

SUMMARY OF INVENTION

The present invention provides a flow path member that improves the cooling efficiency of the workpiece and an adsorption device and a cooling device using the flow path member.

According to one aspect of the invention, a flow path member includes a main body formed of a ceramic sintered body in which a flow path is provided so as to allow a fluid to flow therethrough, wherein the main body includes a projection formed of part of the ceramic sintered body on an inner wall of the flow path.

According to one aspect of the invention, an adsorption device includes the flow path member that adsorbs a workpiece and a fluid supplying unit that supplies the fluid to the flow path of the flow path member.

According to one aspect of the invention, a cooling device includes the flow path member that cools an object and a fluid supplying unit that supplies the fluid to the flow path of the flow path member.

According to the flow path member of one aspect of the invention, since the main body formed of the ceramic sintered body includes the projection formed of part of the ceramic sintered body on an inner wall of the flow path, the projection causes a turbulent flow to occur in the fluid which flows in the flow path. Accordingly, a flow rate of the fluid can be decreased, and thus a cooling efficiency of the workpiece by the flow path member can be improved.

According to the adsorption device of one aspect of the invention, since the adsorption device includes the flow path member, the cooling efficiency of the workpiece to be adsorbed can be improved.

According to the cooling device of one aspect of the invention, since the cooling device includes the flow path member, the cooling efficiency of the workpiece can be improved.

BRIEF DESCRIPTION OF DRAWINGS

FIG. 2(a) is a sectional view of FIG. 1(b) taken along the line A-A, FIG. 2(b) is an enlarged view of a portion R1 of FIG. 2(a), and FIG. 2(c) is a partial enlarged view of a first flow path of FIG. 2(a) in plan view as viewed from the bottom.

DESCRIPTION OF EMBODIMENTS

Figure 1A:
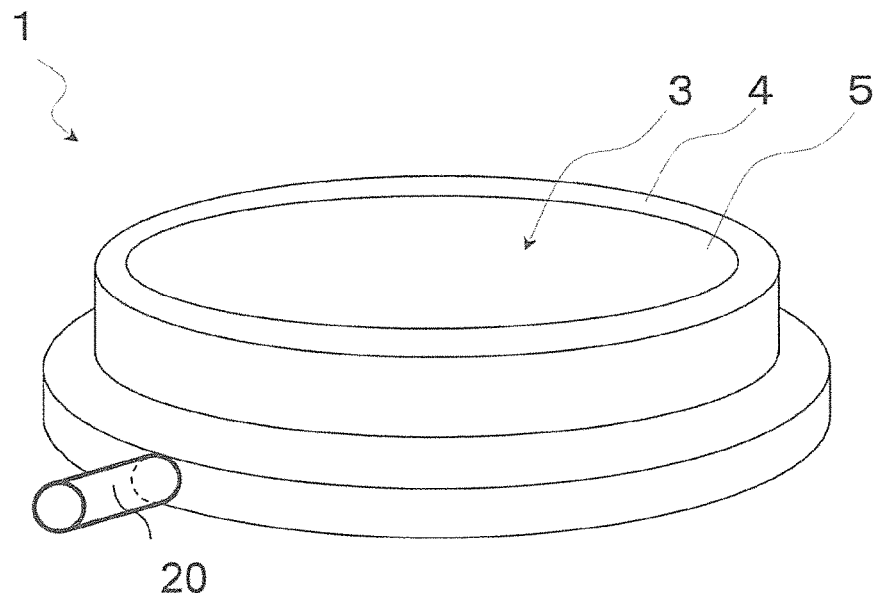
FIG. 1(a) is a perspective view of a flow path member according to one embodiment of the invention.
Figure 1B:
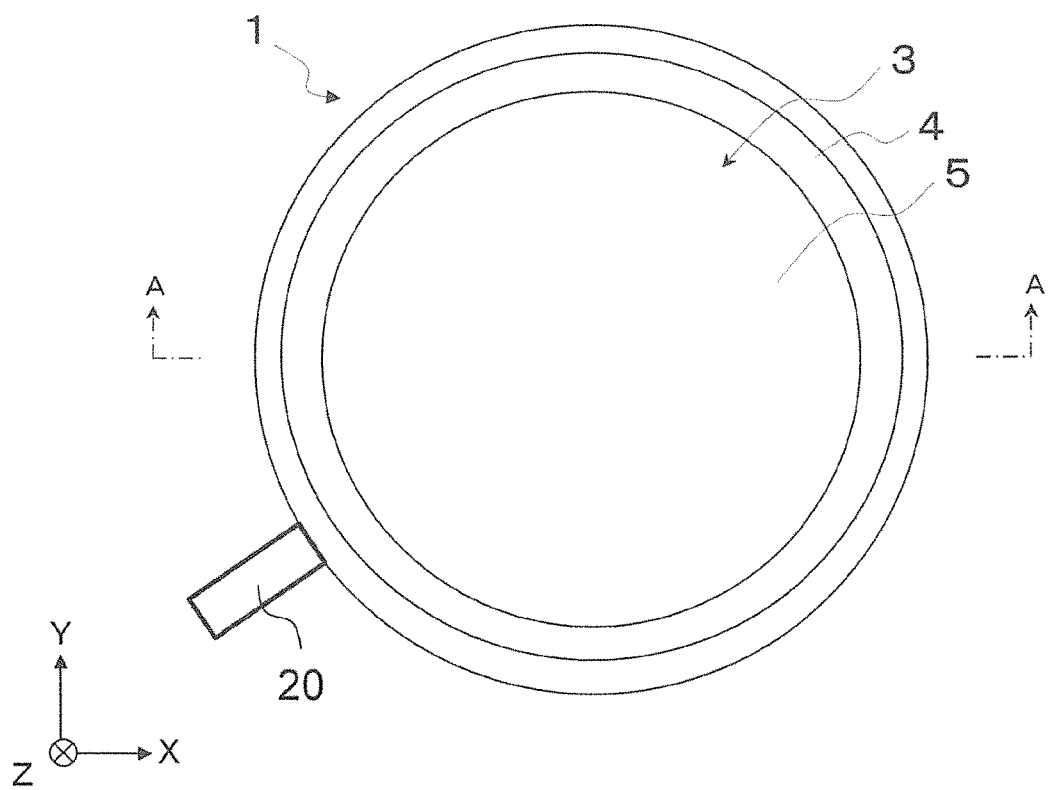
FIG. 1(b) is a top view of FIG. 1(a).

With reference to FIGS. 1 and 2, a flow path member 1 in one embodiment of the invention will be described in detail.

The flow path member 1 of this embodiment is used as a vacuum chuck (adsorption member) in a vacuum adsorption device that holds a workpiece 2 during back grinding process or polishing process of the workpiece 2 which is a semiconductor wafer and adsorbs the workpiece 2 placed on the top adsorption surface. As shown in FIGS. 1 and 2, the flow path member 1 includes a main body 4 in a plate shape having a recess 3 which is open to the top surface and a porous material 5 which is housed in the recess 3 of the main body 4 and serves as an absorption section of the workpiece 2.

The main body 4 which is made up of a dense ceramic sintered body supports the porous material 5 and suctions the workpiece 2 by exhausting air through the recess 3. Further, the main body 4 of this embodiment has a function of cooling the workpiece 2. The ceramic sintered body that forms the main body 4 is preferably aluminum sintered body, but may include, for example, aluminum sintered body, cordierite sintered body and silicon carbide sintered body. Flow path member 1 also includes a fluid supplying unit 20, which supplies fluid to the flow path of flow path member 1.

As shown in FIGS. 2(a) and 2(c), first flow paths 6 which are elongated in a plane direction (X-Y plane direction) and second flow paths 7 which are elongated in a thickness direction (Z direction) are formed in the main body 4.

The first flow paths 6 allow a cooling fluid, for example, liquid such as pure water or gas to flow therethrough and serve as flow paths for cooling the workpiece 2. The first flow paths 6 include inlet ports (not shown in the figure) which are open to a side face or a bottom face of the main body 4 and outlet ports (not shown in the figure) which are open to a side face or a bottom face of the main body 4.

When the cooling fluid is supplied from a fluid supplying unit to the first flow paths 6 via the inlet ports and is discharged from the first flow paths 6 to the fluid supplying unit via the outlet ports, the cooling fluid can flow through the first flow paths 6.

Since the first flow paths 6 are formed to be elongated in the plane direction of the main body 4 as described above, the cooling fluid flows in the plane direction of the main body 4. Accordingly, the top surface of the porous material 3 and the top surface of the main body 4 which form the absorption surface of the flow path member 1, and thus the workpiece 2 can be uniformly cooled. The plane shape of the first flow paths 6 may be formed to be elongated in the plane direction of the main body 4 and may be, for example, in a spiral or meandering shape. The thickness of the first flow paths 6 (Z direction) is set to be, for example, not less than 2 mm and not more than 8 mm. Further, the width of the first flow paths 6 which is vertical to the longitudinal direction and parallel to the plane direction (X-Y plane) is set to be, for example, not less than 2 mm and not more than 8 mm.

The second flow paths 7 allow air to be exhausted from the recess 3 and serve as flow paths for adsorbing the workpiece 2. The second flow paths 7 include exhaust ports 8 which are open to a side face or a bottom face of the main body 4 and intake ports 9 which are open to a bottom face of the recess 3. When air is exhausted from the second flow paths 7 to the exhaust unit (not shown in the figure) via the exhaust ports 8 and is taken from the recess 3 to the second flow paths 7 via the intake ports 9, air can be exhausted from the recess 3 to the outside through the second flow paths 7. A plurality of second flow paths 7 is formed so as to extend through an area which forms the bottom of the recess 3 of the main body 4 in the thickness direction. Further, the second flow paths 7 are independent from the first flow paths 6 and not communicate with the first flow paths 6.

The porous material 5 supports the workpiece 2 and suctions the workpiece 2 by exhausting air in the recess 3 to the outside through the second flow paths 7. The porous material 5 is made up of porous ceramics having gaps of open pores. The porous ceramic may be formed of, for example, a plurality of ceramic particles made of the ceramics having the same nature as that of the ceramic sintered body of the main body 4 and glass which binds the ceramic particles so that the gaps of open pores are formed between the ceramic particles.

The above described flow path member 1 may adsorb the workpiece 2 in the following manner. First, the workpiece 2 is placed on top surface of the flow path member 1. In so doing, as shown in FIG. 2(a), the workpiece 2 is placed on the top surface of the porous material 5 so that an inner area of the workpiece 2 covers the entire porous material 5 and an outer periphery of the workpiece 2 is placed on the top surface of the main body 4. Then, air is exhausted from the recess 3 to the outside through the second flow paths 7 of the main body 4. Since an air pressure inside the recess 3 is decreased, the workpiece 2 is suctioned via the gaps of the porous material 5. As a result, the workpiece 2 is adsorbed on the top surface of the flow path member 1.

Furthermore, the flow path member 1 can cool the workpiece 2 which is adsorbed onto the flow path member 1 by allowing the cooling fluid to flow through the first flow paths 6. As a result, during processing of the workpiece 2, a uniform temperature of the workpiece 2 can be achieved and processing accuracy of the workpiece 2 can be increased.

As shown in FIG. 2(b), the main body 4 of this embodiment includes projections 10 which are formed of part of the ceramic sintered body that forms the main body 4 on an inner wall of the first flow paths 6. That is, the flow path member 1 of this embodiment includes the main body 4 which is made up of the ceramic sintered body, the first flow paths 6 formed inside the main body 4 so as to allow the cooling fluid to flow therethrough, and the projections 10 disposed on the inner wall of the first flow paths 6 and formed of part of the ceramic sintered body.

Since a flow of the cooling fluid is disturbed by the projections 10 when flowing in the first flow paths 6, a turbulent flow is likely to occur in the cooling fluid. Accordingly, a flow rate of the cooling fluid tends to decrease in an area in which the projections 10 are formed. As a result, a period of time of heat exchange between the cooling fluid in the first flow paths 6 and the main body 4 becomes longer, and accordingly, a cooling efficiency of the workpiece 2 by the flow path member 1 can be improved. Further, since the cooling fluid is disturbed the projections 10, the cooling fluid can be efficiently used for heat exchange between the main body 4 and the cooling fluid. This also contributes to increase the cooling efficiency.

Moreover, since the projections 10 are formed of part of the ceramic sintered body that forms the main body 4, the projections 10 and the main body 4 are strongly bonded to each other. Accordingly, the projections 10 can be prevented from being peeled off from the inner wall of the first flow paths 6 by pressure applied by the cooling fluid, and the cooling efficiency of the workpiece 2 due to the projections 10 can be successfully maintained.

If the first flow paths 6 is densely formed in plan view in order to uniformly cool the workpiece 2 by the flow path member 1, the cross sectional area of the first flow paths 6 in the longitudinal direction is decreased and the flow rate of the cooling fluid which flows in the first flow paths 6 tends to increase. However, in the main body 4 of this embodiment, a turbulent flow of the cooling fluid is likely to occur by the projections 10 as described above, and accordingly, the cooling efficiency of the workpiece 2 by the flow path member 1 can be increased even if the cross sectional area of the first flow paths 6 in the longitudinal direction is decreased.

In the cross section of the first flow paths 6 which is vertical to the longitudinal direction, that is, the cross section in the thickness direction (Z direction) of the main body 4, the length of the projections 10 in a projection direction (the amount of projection) is set to be, for example, not less than 0.1 mm and not more than 3 mm, and the length (width) of the projections 10 which is vertical to the projection direction is set to be, for example, not less than 0.1 mm and not more than 3 mm.

Furthermore, the projections 10 of this embodiment are formed to be elongated in the longitudinal direction of the first flow paths 6. Accordingly, the projections 10 and the main body 4 can be strongly bonded to each other without increasing the pressure applied by the cooling fluid to the projections 10 and the projections 10 can be prevented from being peeled off from the inner wall of the first flow paths 6.

A plurality of projections 10 is formed in the longitudinal direction of the first flow paths 6 so as to be separated from each other. As a result, a turbulent flow can be easily formed by the plurality of projections 10.

As shown in FIG. 2(c), the first flow paths 6 of this embodiment is elongated in plan view and has a curved section on at least a portion of the first flow paths 6. The main body 4 includes the plurality of projections 10 which are disposed in a curved section 11 so as to be separated from each other in the longitudinal direction of the first flow paths 6. In the curved section 11 in which the flow rate tends to be decreased, the plurality of projections 10 can help generate a turbulent flow and further decrease the flow rate. Accordingly, the cooling efficiency of the workpiece 2 by the flow path member 1 can be improved.

Further, apertures 12 which are closed pores are disposed inside the projections 10 of this embodiment. Accordingly, the apertures 12 contribute to reduce the weight of the product. Further, damage of the projections 10 due to the cooling fluid entering the apertures 12 can be reduced since the apertures 12 are closed pores. The cross section of the aperture 12 which is vertical to the longitudinal direction of the first flow paths 6 is, for example, in a circular shape, and the width (diameter) of the aperture 12 is, for example, not less than 0.1 mm and not more than 3 mm. Further, in this embodiment, each projection 10 has one aperture 12 in the cross section which is vertical to the longitudinal direction of the first flow paths 6.

The main body 4 of this embodiment includes a pair of projections 10 which face each other on the inner wall of the first flow paths 6 in the cross section which is vertical to the longitudinal direction of the first flow paths 6. Accordingly, positional deviation of a plurality of turbulent flow generated in the cooling fluid can be reduced in the cross section which is vertical to the longitudinal direction of the first flow paths 6 and more uniform heat exchange efficiency in the first flow paths 6 can be achieved.

Further, when the projections 10 have a corner in the cross section which is vertical to the longitudinal direction of the first flow paths 6, a vortex is generated in the cooling fluid around the corner and the cooling fluid may be stagnated. In this case, the flow of the cooling fluid is stopped around the corner, rather than the flow rate of the cooling fluid is decreased. Accordingly, the efficiency of heat exchange by the cooling fluid tends to be decreased.

The surface of the projection 10 of this embodiment forms a convex curve in the cross section which is vertical to the longitudinal direction of the first flow paths 6. As a result, stagnation of the cooling fluid can be reduced, and accordingly, the efficiency of heat exchange by the cooling fluid can be improved.

Further, the first flow path 6 of this embodiment is in a rectangular shape in the cross section vertical to the longitudinal direction. The main body 4 includes the projections 10 at the corners of the first flow paths 6 in the cross section vertical to the longitudinal direction of the first flow paths 6. Accordingly, since the projections 10 are disposed at the rectangular-shaped corners of the first flow paths 6 in the cross section which is vertical to the longitudinal direction of the first flow paths 6, stagnation of the cooling fluid can be reduced.

As described above, according to the flow path member 1 of this embodiment, the workpiece 2 can be efficiently cooled by the first flow paths 6.

Next, a manufacturing method of the above flow path member 1 will be described.

Figure 3A:
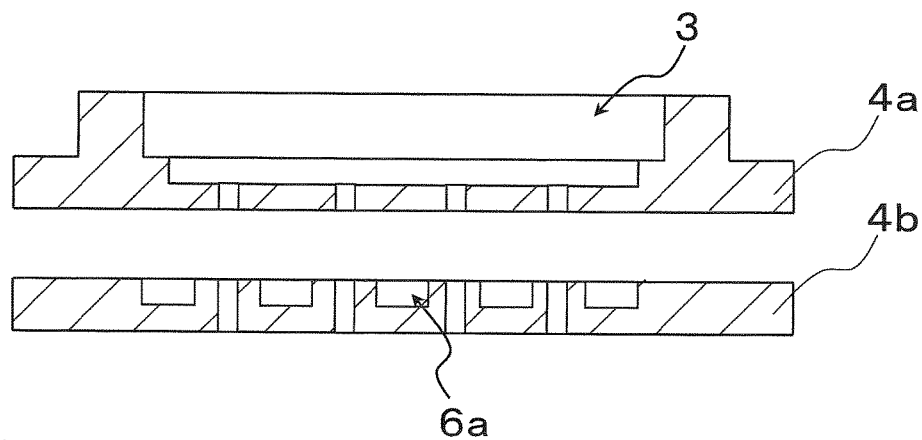
FIGS. 3(a) through 3(c) are sectional views which show a manufacturing process of the flow path member of FIG. 1(a) in the thickness direction.

(1) As shown in FIG. 3(a), an upper compact 4a having the recess 3 formed on the top surface, and a lower compact 4b having depressed areas 6a which serve as the first flow paths 6 formed on the top surface are formed. Specifically, they are formed in the following manner.

First, ceramic particles are mixed with pure water and organic binder and then wet-blended by a ball mill to make slurry. Then, the slurry is granulated by spray drying. Then, the granulated ceramic particles are formed into compact by using various forming methods. In so doing, the compact for the upper compact 4a and the compact for the lower compact 4b are made to have the same ceramic composition. The upper compact 4a is formed to have the recess 3 on the top surface by cutting the compact and a flat surface on the bottom surface, while the lower compact 4b is formed to have the depressed areas 6a on the top surface and a flat surface on the bottom surface.

Figure 3B:
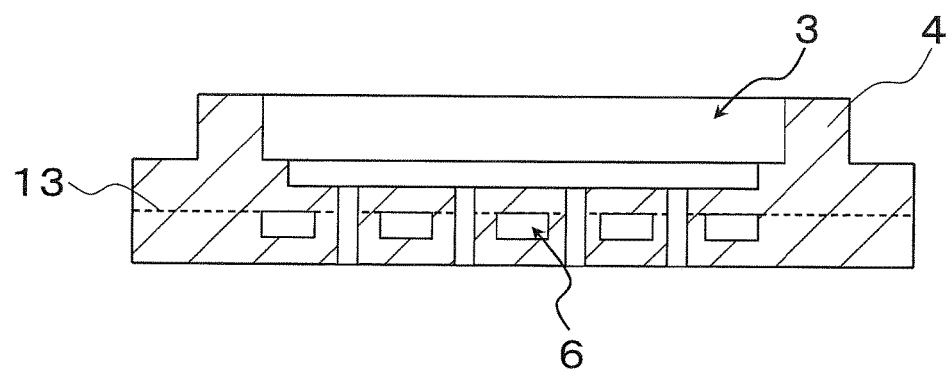

(2) As shown in FIG. 3(b), the bottom surface of the upper compact 4a and the top surface of the lower compact 4b are bonded to each other via ceramic paste (not shown in the figure). After that, the upper compact 4a, the lower compact 4b and the ceramic paste are simultaneously sintered so as to form the main body 4 which is composed of one ceramic sintered body. Specifically, this process is performed in the following manner.

First, the ceramic paste is applied on the top surface of the lower compact 4b between the depressed areas 6a. Then, the bottom surface of the upper compact 4a and the top surface of the lower compact 4b are bonded to each other via the applied ceramic paste. Then, the bonded compact is calcined at a temperature of, for example, 1400 degrees Celsius or more and 1800 degrees Celsius or less, and the upper compact 4a, the lower compact 4b and the ceramic paste are simultaneously sintered so as to form one ceramic sintered body. Then, the ceramic sintered body is grinded to form the main body 4 which is formed of the ceramic sintered body in a desired form.

As described above, since the upper compact 4a and the lower compact 4b are calcined after the flat surface of the bottom surface of the upper compact 4a and the top surface of the lower compact 4b on which the depressed areas 6a are formed are bonded, the main body 4 which is composed of the ceramic sintered body having the first flow paths 6a inside can be formed.

The above ceramic paste is a mixture of ceramic particles and pure water. These ceramic particles have the same composition as that of the ceramic particles used for the compact of the main body 4. Since the ceramic paste is simultaneously sintered with the upper compact 4a and the lower compact 4b, the main body 4 can be formed as one ceramic sintered body which is entirely made of the same ceramic composition.

In this embodiment, the projections 10 are disposed in the first flow paths 6 of the main body 4. The projections 10 are manufactured in the following manner.

First, the ceramic paste having a moisture rate (percentage of pure water to the entire ceramic paste) of 40 mass % or more and 80 mass % or less is provided. The viscosity of the ceramic paste may be adjusted by a thickener such as organic matter.

Then, the ceramic paste is applied on the top surface of the lower compact 4b between the depressed areas 6a so that the applied thickness becomes not less than 0.1 mm and not more than 2 mm. In so doing, the thickness of the ceramic paste is adjusted and the ceramic paste is uniformly applied by placing a mesh on the top surface of the lower compact 4b and applying the ceramic paste via the mesh. Further, during application of the ceramic paste, the humidity is set to be 50% RH or more so that the ceramic paste is prevented from being dried and the moisture rate of the ceramic paste is maintained.

The bottom surface of the upper compact 4a is bonded to the top surface of the lower compact 4b on which the ceramic paste is applied. Then, a pressure of 4.9 kPa or more and 98 kPa or less is applied in the up and down direction for a period of 0.5 hour or more so as to allow part of the ceramic paste to be pushed out from a bonded interface between the upper compact 4a and the lower compact 4b into the depressed areas 6a so as to form projections. In so doing, in order to prevent the ceramic paste from being dried before bonding and to keep the moisture rate of the ceramic paste, the bottom surface of the upper compact 4a is bonded to the top surface of the lower compact 4b immediately after the ceramic paste is applied.

Then, the ceramic paste is simultaneously calcined with the upper compact 4a and the lower compact 4b so that the projections made of the ceramic paste become the projections 10 which are formed of part of the ceramic paste that forms the main body 4.

As described above, part of the ceramic paste can be pushed out into the depressed areas 6a by appropriately adjusting the moisture rate and the thickness of the ceramic paste and the pressurization condition of the upper compact 4a and the lower compact 4b. Those projections can be provided as the projections 10 by calcining the projections simultaneously with the upper compact 4a, the lower compact 4b and the ceramic paste.

Further, since the projections 10 are formed by calcining the projections made of part of the ceramic paste which is pushed out from the bonded interface 13, pairs of projections 10 are formed on the inner wall of the first flow paths 6 so as to face each other, and the projections 10 are formed to be elongated in the longitudinal direction of the first flow paths 6.

Furthermore, the moisture rate of the ceramic paste is adjusted as described above. As a result, when the ceramic paste is pushed out, the surface of the projection, and thus the surface of the projection 10 is formed in the shape of convex curve due to surface tension. Further, when the surface of the projection is formed in the shape of convex curve, the surface tension applied to the projection causes the shape of the projection to be round. This causes the center portion of the ceramic paste to be pulled outward, and accordingly, the aperture 12 which is a closed pore is formed in the projection. The projections are calcined so as to form the aperture 12 which is a closed pore in the projection 10. Further, during calcination of the ceramic paste, since the projections are contracted in the longitudinal direction and divided into a plurality of portions, a plurality of projections 10 which are separated from each other in the longitudinal direction can be formed. Particularly, since the direction of contraction varies in curved section 11, the projection is easily divided into a plurality of portions in the longitudinal direction. Accordingly, a plurality of projections 10 can be formed in the curved section 11.

Figure 3C:
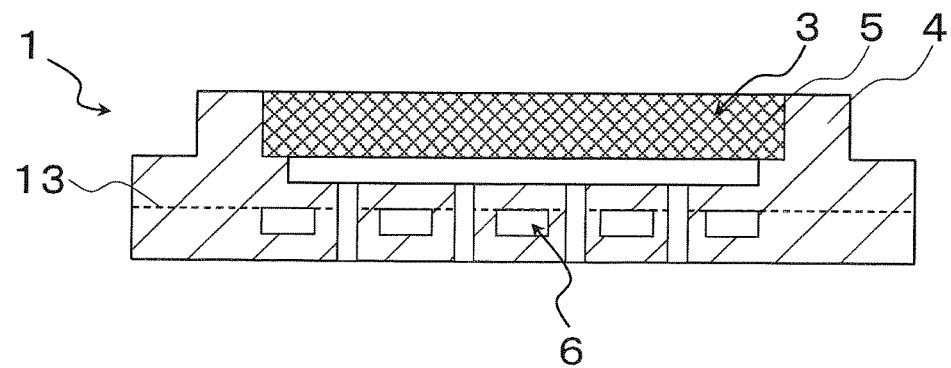

(3) As shown in FIG. 3(c), the porous material 5 is formed in the recess 3 by using a known technique.

The flow path member 1 can be manufactured in the above described manner.

The present invention is not limited to the above embodiment, and various modifications, alterations, combinations or the like can be made without departing from the spirit of the invention.

For example, the above embodiment has been described by an example in which the flow path member 1 is used for back grinding process or polishing process of semiconductor wafers. However, the flow path member 1 may be used for any other semiconductor manufacturing process such as exposure process, etching process or film forming process of semiconductor wafers or may be used for FPD manufacturing process.

Figure 4A:
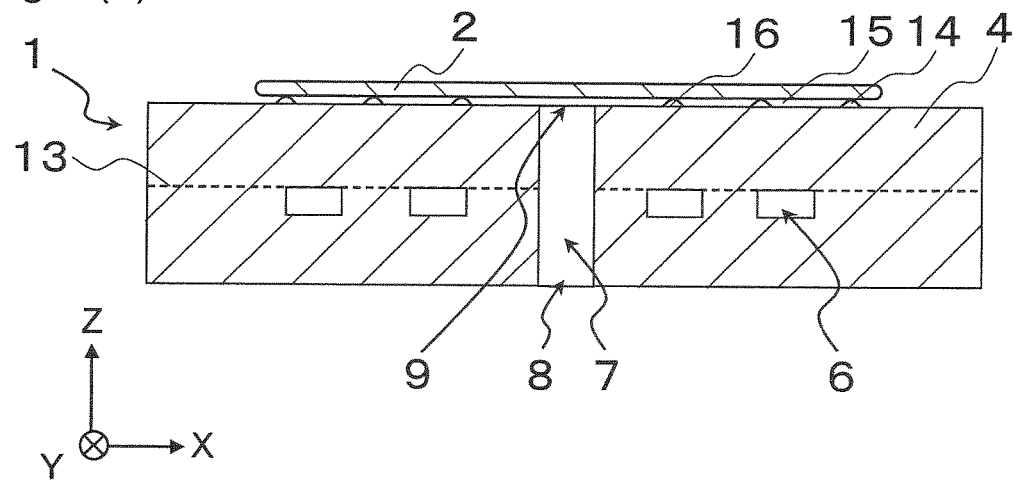
FIG. 4(a) is a sectional view in the thickness direction of the flow path member of another embodiment of the invention.

Further, the above embodiment has been described by an example of the flow path member 1 which is a vacuum chuck (adsorption member) that includes the porous material 5 as an absorption section. However, the flow path member 1 may have any other configuration. For example, as shown in FIG. 4(a), the flow path member 1 may include, as an adsorption section, a seal section 14 of an annular shape which corresponds to the shape of the object 2, a bottom 15 disposed on the inner side of the seal section 14, and a plurality of pins 16 which extend from the bottom 15. Such a flow path member 1 may be a vacuum chuck or may be an electrostatic chuck or any other adsorption member. Further, the flow path member 1 may not be an adsorption member and may be, for example, a vacuum chuck or a cooling member which cools an object such as a plasma generating electrode. In this case, the flow path member 1 is used as a cooling member in a cooling device.

Further, the above embodiment has been described by an example in which the cooling fluid is used as a fluid. However, any other fluid may be used. The fluid may be, for example, plasma generating gas. In this case, since the main body 4 includes the projections 10 formed of part of the ceramic sintered body on the inner wall of the first flow paths 6, a turbulent flow occurs in the plasma generating gas and the plasma generating gas is stirred by the projections 10. Accordingly, by using such a plasma generating gas, more uniform plasma can be generated.

Figure 4B:
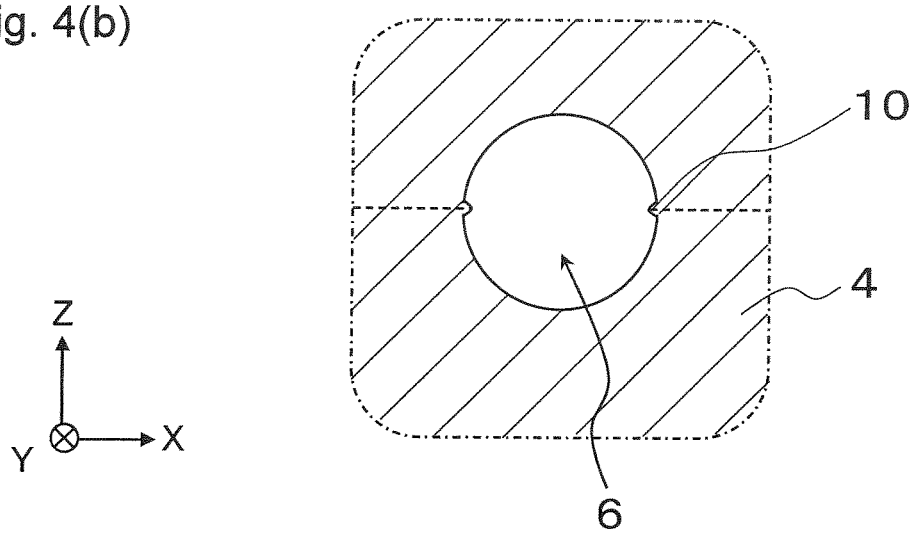
FIG. 4(b) is an enlarged view of a portion corresponding to FIG. 2(b) of the flow path member in another embodiment of the invention.

Further, the above embodiment has been described by an example in which the first flow paths 6 is in a rectangular shape in a cross section vertical to the longitudinal direction. However, the cross section vertical to the longitudinal direction of the first flow paths 6 may not be a rectangular shape, and for example may be a circular shape as shown in FIG. 4(b). In the example shown in FIG. 4(b), the main body 4 includes a pair of the projections which face each other on the inner wall of the flow path with a center of the flow path interposed therebetween in the cross section which is vertical to the longitudinal direction of the flow path. Accordingly, positional deviation of a plurality of turbulent flow generated in the cooling fluid can be reduced in the cross section which is vertical to the longitudinal direction of the first flow paths 6 and more uniform heat exchange efficiency in the first flow paths 6 can be achieved. This main body 4 can be manufactured by forming the depressed areas 6a having a semi-circular shape in the cross section vertical to the longitudinal direction at corresponding positions on the bottom surface of the upper compact 4a and the top surface of the lower compact 4b during the above process (1).

Figure 4C:
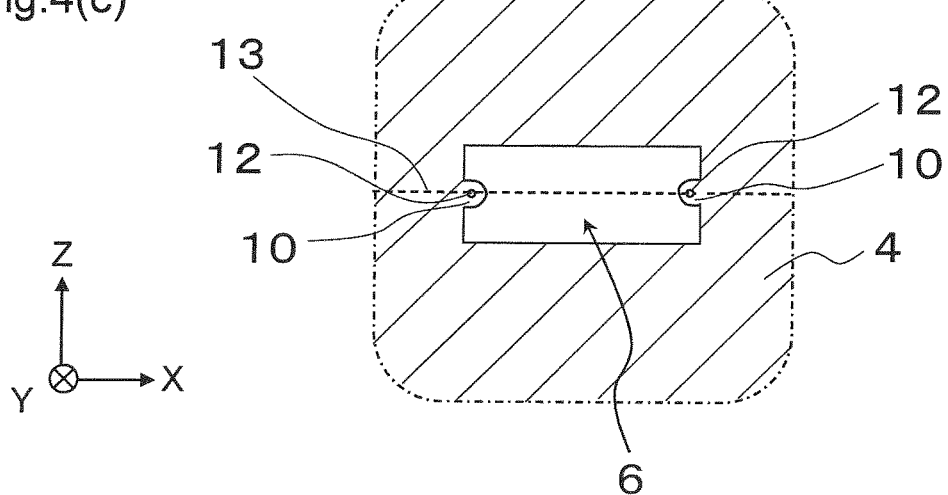
FIG. 4(c) is an enlarged view of a portion corresponding to FIG. 2(b) of the flow path member in another embodiment of the invention.

Further, the above embodiment has been described by an example in which the first flow paths 6 is in a rectangular shape in the cross section vertical to the longitudinal direction and the main body 4 includes the projections 10 at the corners of the first flow paths 6 in the cross section vertical to the longitudinal direction of the first flow paths 6. However, the projections 10 may not be disposed at the corners of the first flow paths 6, and for example, the projections 10 may be disposed on side faces of the first flow paths 6 as shown in FIG. 4(c). In this case, positional deviation of a plurality of turbulent flow generated in the cooling fluid can be reduced in the cross section which is vertical to the longitudinal direction of the first flow paths 6 and more uniform heat exchange efficiency in the first flow paths 6 can be achieved. This main body 4 can be manufactured by forming the depressed areas 6a having a rectangular shape in the cross section vertical to the longitudinal direction at corresponding positions on the bottom surface of the upper compact 4a and the top surface of the lower compact 4b during the above process (1).

REFERENCE SIGNS LIST 1 flow path member
2 workpiece 3 recess
4 main body
5 porous material
6 first flow path
7 second flow path
8 exhaust port
9 intake port
10 projection
11 curved section
12 aperture
13 bonded interface

The invention claimed is:

1. A flow path member, comprising:
a main body containing a ceramic sintered body, and comprising:
an inner wall inside the main body;
a flow path surrounded by the inner wall so as to allow a fluid to flow therethrough in a flow direction, wherein the flow direction is longitudinal along the inner wall, the flow path elongated in the flow direction and comprising a curved section;
a first projection on the inner wall and extending longitudinally along the inner wall, comprising a closed pore inside the first projection; and
a second projection on the inner wall,
wherein the first and second projections are disposed in the curved section, and are separated from each other in the flow direction.

2. The flow path member according to claim 1, wherein the first projection is elongated in the flow direction.

3. The flow path member according to claim 1, wherein the main body further comprises a third projection on the inner wall,
the first and third projections face opposite to each other on the inner wall in a cross section of the main body, the cross section perpendicular to the flow direction of the flow path.

4. The flow path member according to claim 3, wherein the flow path has a rectangular shape with a corner in the cross section, and the first projection is located at the corner in the cross section.

5. The flow path member according to claim 4, wherein a surface of the projection has a shape of convex curve in the cross section.

6. The flow path member according to claim 3, wherein the flow path has a rounded shape in the cross section.

7. A chucking device, comprising:
the flow path member according to claim 1; and
a fluid supplying unit that supplies the fluid to the flow path of the flow path member.

8. A cooling device, comprising:
the flow path member according to claim 1; and
a fluid supplying unit that supplies the fluid which is a cooling fluid to the flow path of the flow path member.

9. A flow path member comprising:
a main body containing a ceramic sintered body;
an inner wall in the main body;
a flow path surrounded by the inner wall, and allowing a fluid to flow therethrough in a flow direction; and
a plurality of projections disposed on the inner wall, and comprising first and second projections disposed in a line and spaced in the flow direction.

10. The flow path member according to claim 9, wherein the main body comprises a first portion and a second portion, the first portion bonded to the second portion with an interface therebetween,
the flow path is disposed between the first portion and the second portion, and the first projection is located on the interface in a cross section that is perpendicular to the flow direction.

11. A chucking device, comprising:
the flow path member according to claim 9; and
a fluid supplying unit that is connected to the flow path member, and that is configured to supply the fluid to the flow path.

12. A cooling device, comprising:
the flow path member according to claim 9; and
a fluid supplying unit that is connected to the flow path member, and that is configured to supply the fluid to the flow path for cooling.

* * * * *